United States Patent
Yamanaka et al.

(10) Patent No.: US 8,526,189 B2
(45) Date of Patent: Sep. 3, 2013

(54) POWER MODULE

(75) Inventors: Gentaro Yamanaka, Nagoya (JP); Hiroshi Osada, Komaki (JP); Yasushi Yamada, Miyoshi (JP); Naoto Kikuchi, Seto (JP); Norifumi Furuta, Toyota (JP); Takashi Ueno, Toyota (JP)

(73) Assignees: Kabushiki Kaisha Toyota Chuo Kenkyusho, Aichi-gun (JP); Toyota Jidosha Kabushiki Kaisha, Toyota (JP)

( * ) Notice: Subject to any disclaimer, the term of this patent is extended or adjusted under 35 U.S.C. 154(b) by 391 days.

(21) Appl. No.: 13/074,675

(22) Filed: Mar. 29, 2011

(65) Prior Publication Data

US 2011/0242770 A1  Oct. 6, 2011

(30) Foreign Application Priority Data

Apr. 2, 2010 (JP) ................. 2010-086430

(51) Int. Cl.
*H05K 5/00* (2006.01)
(52) U.S. Cl.
USPC ............................ 361/733; 361/794; 361/730
(58) Field of Classification Search
USPC ................. 361/730–733, 776, 777, 715, 794; 345/60, 63, 66, 67; 315/169.4; 429/169, 429/170
See application file for complete search history.

(56) References Cited

U.S. PATENT DOCUMENTS

| | | | |
|---|---|---|---|
| 5,134,546 A * | 7/1992 | Izumi et al. | 361/736 |
| 6,664,629 B2 * | 12/2003 | Maeno | 257/723 |
| 7,067,392 B2 * | 6/2006 | Yamazaki et al. | 438/455 |
| 7,436,672 B2 * | 10/2008 | Ushijima et al. | 361/715 |
| 7,656,016 B2 | 2/2010 | Yoshimatsu et al. | |
| 2012/0300522 A1 * | 11/2012 | Tokuyama et al. | 363/131 |

FOREIGN PATENT DOCUMENTS

| | | |
|---|---|---|
| JP | A-6-21323 | 1/1994 |
| JP | A-6-69392 | 3/1994 |
| JP | A-8-55956 | 2/1996 |
| JP | A-8-162579 | 6/1996 |
| JP | A-9-219970 | 8/1997 |
| JP | A-2001-53106 | 2/2001 |
| JP | A-2003-31765 | 1/2003 |
| JP | A-2005-209784 | 8/2005 |

(Continued)

OTHER PUBLICATIONS

Nov. 20, 2012 Office Action issued in Japanese Patent Application No. 2010-086430 (with translation).

(Continued)

*Primary Examiner* — Hung S Bui
(74) *Attorney, Agent, or Firm* — Oliff & Berridge, PLC

(57) ABSTRACT

A power module includes a semiconductor device having a first and second arms, and gate driving circuit board. The first arm includes a first extending electrode, a first gate electrode of a first power device extending in a direction different from the first extending electrode, and a first output electrode extending in the different direction from the first gate electrode. The second arm stacked on the first arm includes a second extending electrode extending in the first extending electrode extending direction in an insulating state, a second gate electrode of a second power device, extending in the first gate electrode extending direction, and a second output electrode extending in the first output electrode extending direction with electrical connection thereto. The gate driving circuit board is disposed at the first and second gate electrodes extending side so as to face the semiconductor device.

3 Claims, 17 Drawing Sheets

(56) References Cited

FOREIGN PATENT DOCUMENTS

| | | |
|---|---|---|
| JP | A-2006-100327 | 4/2006 |
| JP | A-2006-148098 | 6/2006 |
| JP | A-2006-165409 | 6/2006 |
| JP | A-2006-190972 | 7/2006 |
| JP | A-2008-166421 | 7/2008 |

OTHER PUBLICATIONS

Aug. 13, 2012 Japanese Office Action issued in Japanese Patent Application No. 2010-086430 (with Translation).

* cited by examiner

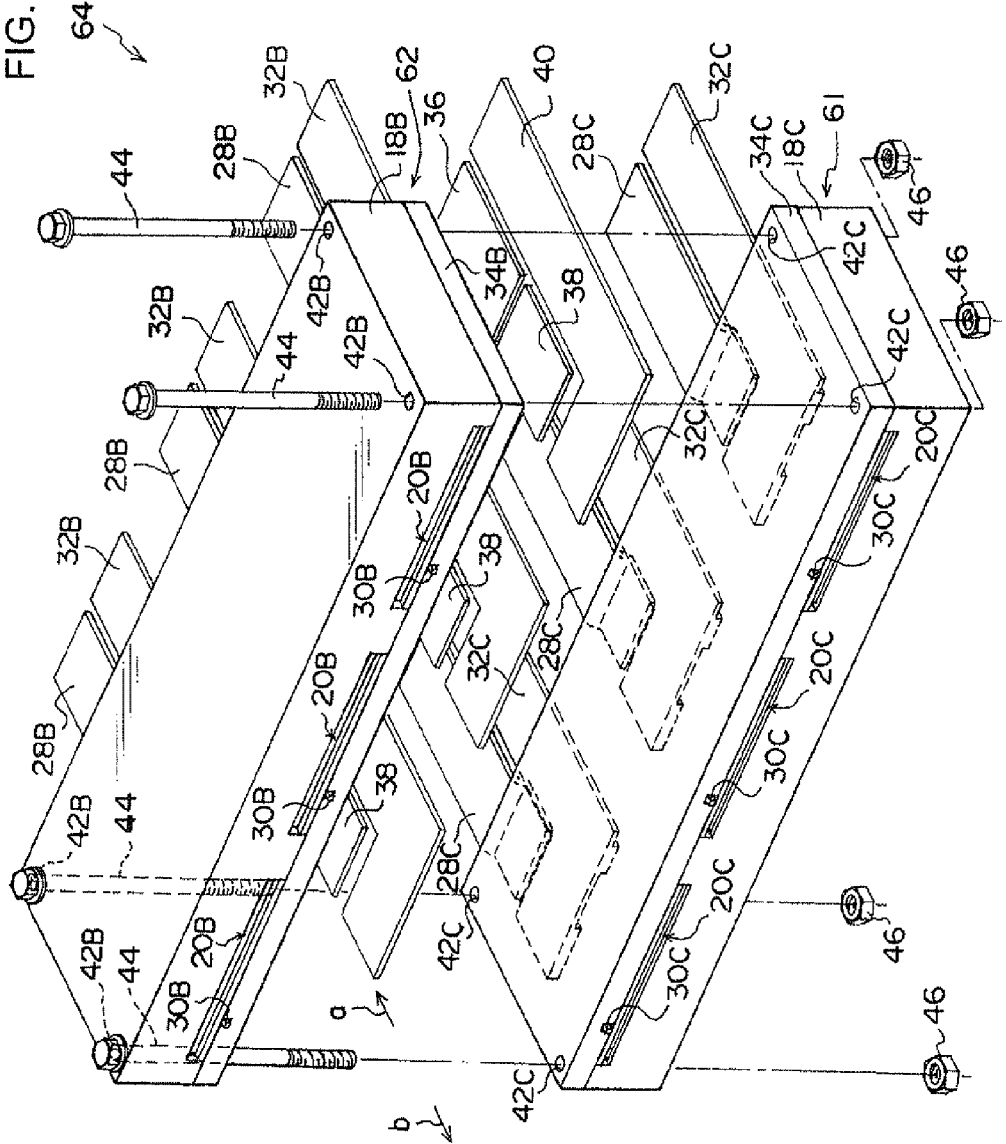

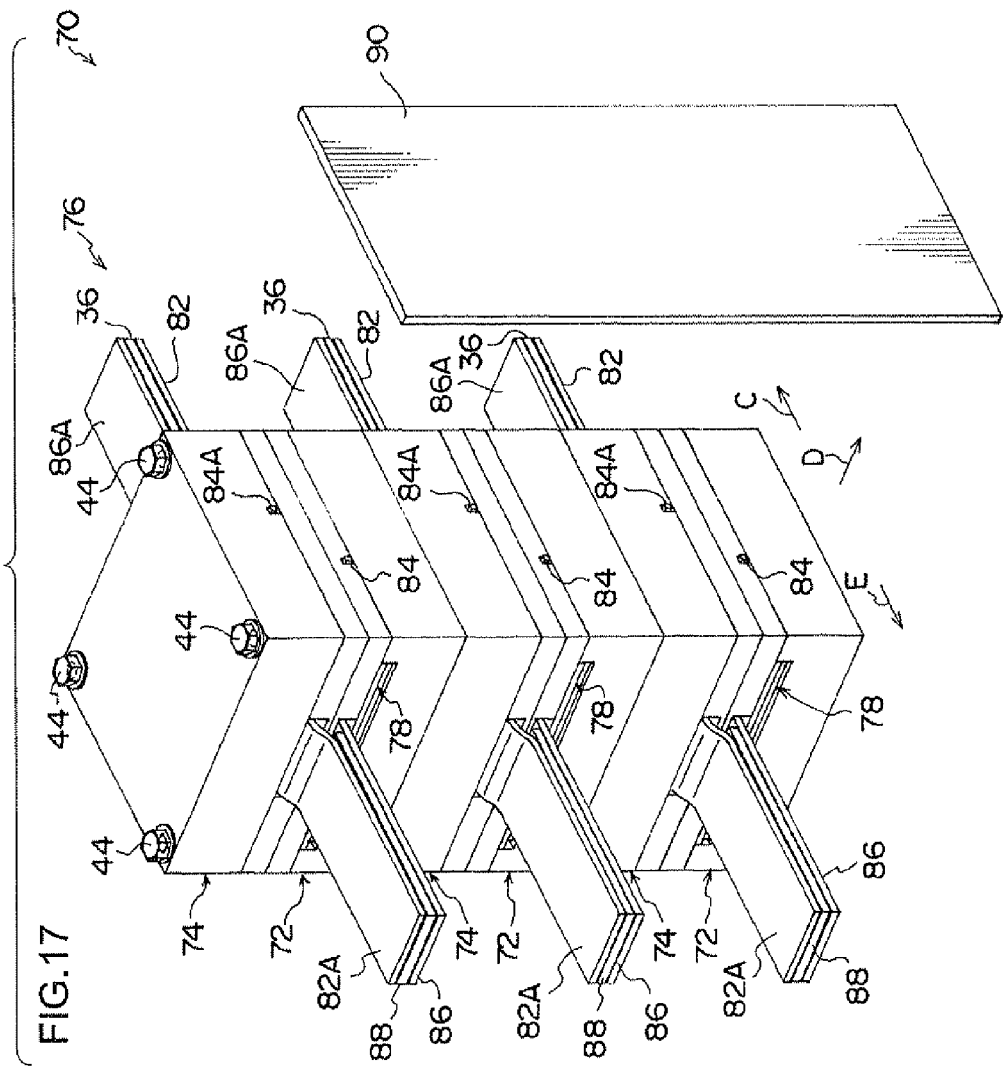

POWER MODULE

CROSS-REFERENCE TO RELATED APPLICATION

This application is based on and claims priority under 35 USC 119 from Japanese Patent Application No. 2010-086430 filed on Apr. 2, 2010.

BACKGROUND

1. Technical Field

The present invention relates to a power module including a power device.

2. Related Art

A power module that is modularized including a power device is known (for example, see Japanese Patent Application Laid-Open No. 8-162579).

However, in this structure, when a parasitic inductance is increased and large surge voltage is generated at the time of a switching operation, there may be a case in which the high-speed characteristic of the power device cannot be effectively utilized.

SUMMARY

Taking into consideration the above situation, the present invention provides a power module that can take advantage of the high speed characteristic of a power device.

An aspect of the present invention is a power module including: a semiconductor device that includes a first arm including a first substrate, a first power device disposed on the first substrate, a first extending electrode, of one of a P electrode or an N electrode, extending from the first substrate along a plate surface direction of the first substrate, the first extending electrode being connected to a circuit to which the first power device is connected, and being connected to one side of a DC power supply, a first gate electrode that is a gate electrode of the first power device, the first gate electrode extending from the first substrate in a direction different from the first extending electrode along the plate surface direction of the first substrate, and a first output electrode extending from the first substrate in a direction different from the first gate electrode along the plate surface direction of the first substrate, and being connected to the circuit to which the first power device is connected, and a second arm that is stacked on the first arm, including a second substrate facing the first substrate, a second power device disposed on the second substrate, a second extending electrode, of the other one of the P electrode or the N electrode, extending from the second substrate in a same direction as the first extending electrode so as to be facing the first extending electrode in an insulating state, the second extending electrode being connected to a circuit to which the second power device is connected, and being connected to the other side of the DC power supply, a second gate electrode that is a gate electrode of the second power device, extending from the second substrate in the same direction as the first gate electrode, and a second output electrode extending from the second substrate in the same direction as the first output electrode so as to be electrically connected to the first output electrode, the second output electrode being connected to the circuit to which the second power device is connected; and a gate driving circuit board that is disposed at a side to which the first gate electrode and the second gate electrode extend so as to be facing the semiconductor device, the gate driving circuit board comprising a gate driving circuit that is electrically connected to the first gate electrode and the second gate electrode and that supplies a bias voltage to the first gate electrode and the second gate electrode.

According to the above aspect, since the first extending electrode and the second extending electrode (P electrode and N electrode) extend in the same direction and are disposed opposing each other in an insulating state, currents in opposite directions pass through the first extending electrode and the second extending electrode (P electrode and N electrode) which generate magnetic fields having opposite directions to each other. These magnetic fields cancel each other and generate a mutual inductance that reduces the parasitic inductance. Further, the first gate electrode and the second gate electrode extend in the same direction and extend in a direction different from those of the first extending electrode, the second extending electrode, the first output electrode, and the second output electrode. Therefore, the gate driving circuit board can be disposed at a side to which the first gate electrode and the second gate electrode extend so as to be facing the semiconductor device. In other words, the gate driving circuit formed on the gate driving circuit board is connected with the first gate electrode and the second gate electrode in a state in which the gate driving circuit is disposed physically close to the first gate electrode and the second gate electrode. Accordingly, the wiring length connecting between the first gate electrode and the second gate electrode and the gate driving circuit can be made short, and the parasitic inductance is reduced.

In the above aspect, the first extending electrode, the second extending electrode, the first output electrode, and the second output electrode may extend in the same direction.

Due to this configuration, the entire configuration can be made compact.

In the above aspect, the semiconductor device may include a conductive member that electrically connects the first output electrode and the second output electrode by being sandwiched between the first output electrode and the second output electrode in at least one of a plastically deformed state or an elastically deformed state.

Due to this configuration, variations in the thickness direction of the first output electrode and the second output electrode, which are stacked on each other, are compensated for.

As described above, the power module of the above aspect can take advantage of the high speed characteristic of the power device.

Further, the high speed characteristic of the power device can be utilized while making the entire configuration of the power module compact.

Further, the variations in the thickness direction of the first output electrode and the second output electrode, which are stacked on each other, can be compensated for.

BRIEF DESCRIPTION OF THE DRAWINGS

Exemplary embodiments of the present invention will be described in detail based on the following figures, wherein:

FIGS. 3A and 3B are perspective views showing a manufacturing process of a first arm, wherein FIG. 3A is a diagram showing a state in which a solder layer is disposed on a first substrate and FIG. 3B is a diagram showing a state in which a first output electrode, an IGBT element, and a diode are soldered;

FIGS. 4A and 4B are perspective views showing the manufacturing process of the first arm, wherein FIG. 4A is a diagram showing a state in which an N electrode is additionally soldered from the state of FIG. 3B and FIG. 4B is a diagram showing a state in which the N electrode is additionally resin-molded from the state of FIG. 4A;

FIGS. 10A and 10B are perspective views showing a manufacturing process of a second arm in the second exemplary embodiment, wherein FIG. 10A is a diagram showing a state in which a solder layer is disposed on a second substrate and FIG. 10B is a diagram showing a state in which an N electrode, an IGBT element, and a diode are soldered;

FIGS. 11A and 11B are perspective views showing the manufacturing process of the second arm in the second exemplary embodiment, wherein FIG. 11A is a diagram showing a state in which a second output electrode is additionally soldered from the state of FIG. 10B and FIG. 11B is a diagram showing a state in which the second electrode is additionally resin-molded from the state of FIG. 11A;

FIG. 12 is an exploded perspective view in which the semiconductor device according to the second exemplary embodiment is viewed from a gate extending side;

FIG. 17 is an exploded perspective view showing a state before a gate driving circuit board is assembled with the semiconductor device according to the third exemplary embodiment.

DETAILED DESCRIPTION

First Exemplary Embodiment

A power module according to a first exemplary embodiment will be described below with reference to FIGS. 1 to 7.

Figure 1:
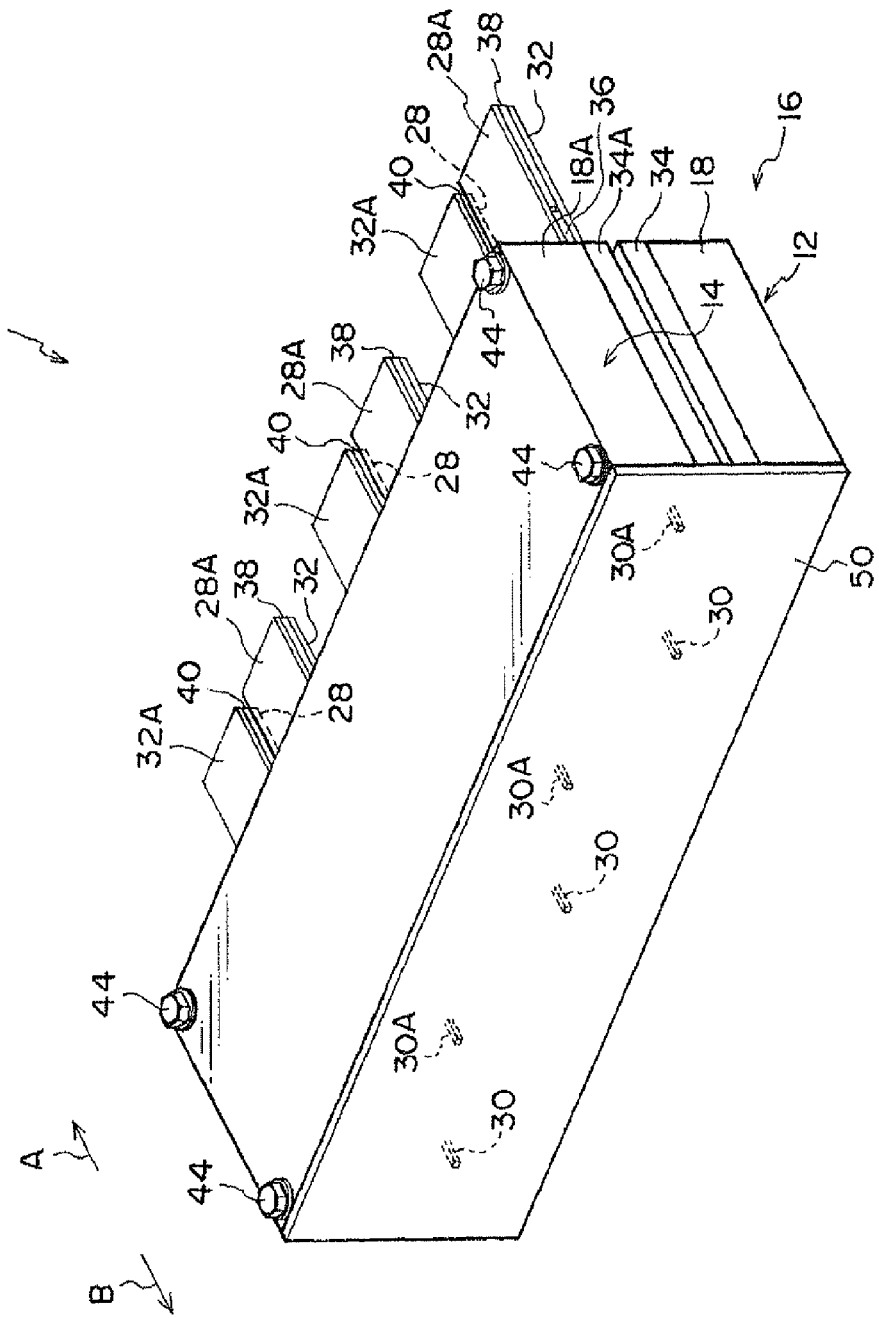
FIG. 1 is an appearance perspective view showing a power module according to a first exemplary embodiment of the present invention.

FIG. 1 shows an appearance perspective view of a power module 10 according to the first exemplary embodiment. The power module 10 according to the first exemplary embodiment has a semiconductor device 16 including a first arm 12 and a second arm 14, and the semiconductor device 16 is configured as a three-phase inverter that converts direct current into alternating current.

Figure 2:
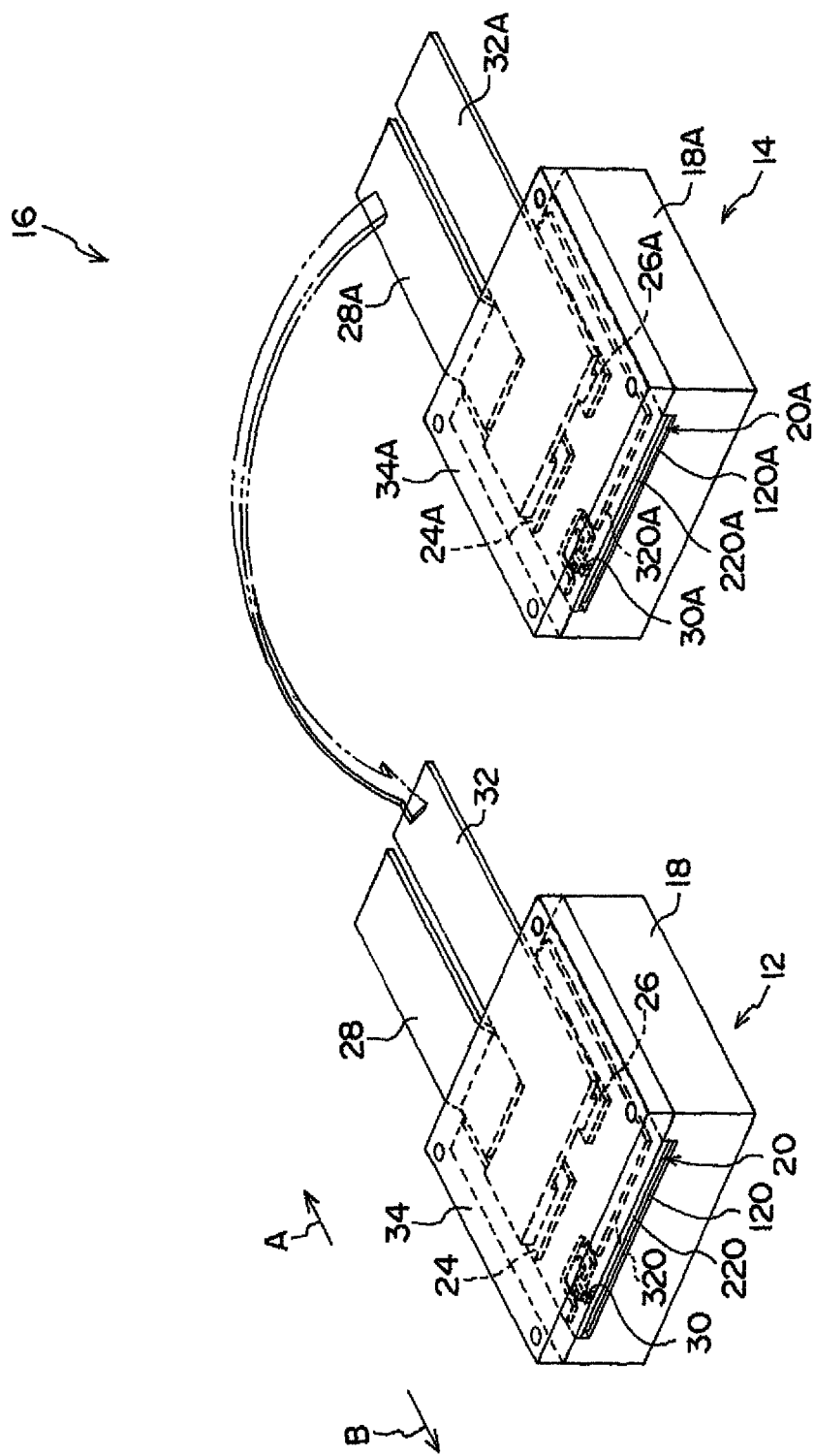
FIG. 2 is an exploded perspective view showing main components of a portion corresponding to one phase of a semiconductor device according to the first exemplary embodiment in a disassembled state.

FIG. 2 shows an exploded perspective view of main components of a portion corresponding to one phase of the semiconductor device 16 in a disassembled state. The component shown at the left of FIG. 2 configures the first arm 12 that is a lower arm and the component shown at the right of FIG. 2 configures the second arm 14, that is an upper arm which overlaps with the first arm 12.

The three-phase first arm 12 has a structure in which three first arms 12 shown in FIG. 2 are serially connected in a traverse direction in FIG. 2. Although in the first exemplary embodiment, the three first arms are integrated in advance (see FIG. 6), the three first arms 12 may also be configured by connecting and integrating three separate first arms. Similarly, the three-phase second arm 14 has a structure in which three second arms 14 shown in FIG. 2 are serially connected in a traverse direction in FIG. 2. Although in the first exemplary embodiment, the three second arms are integrated in advance (see FIG. 6), the three second arms 14 may also be configured by connecting and integrating three separate second arms.

FIGS. 3A-3B and FIGS. 4A-4B show perspective views of a sequence of a manufacturing process (manufacturing sequence) of the first arm 12. Hereinafter, a configuration of the first arm 12 will be described by referring to FIGS. 3A-3B and FIGS. 4A-4B.

As shown in FIG. 2, the first arm 12 includes a substantial rectangular parallelepiped first cooler 18. The first cooler 18 is made of an aluminum (Al) alloy. Although not shown, the first cooler 18 is attached with a terminal of a refrigerant in the final step of the manufacturing process of the first arm 12.

A first substrate 20 is disposed on the first cooler 18. The first substrate 20 has a stacked structure (DBA substrate) in which an Al layer 120 made of aluminum (Al), an AlN layer 220 made of aluminum nitride (AlN), and an aluminum layer 320 made of aluminum (Al) are stacked in this order. A rear surface of the first substrate 20 is bonded to a top surface of the first cooler 18 by brazing.

Figure 3A:
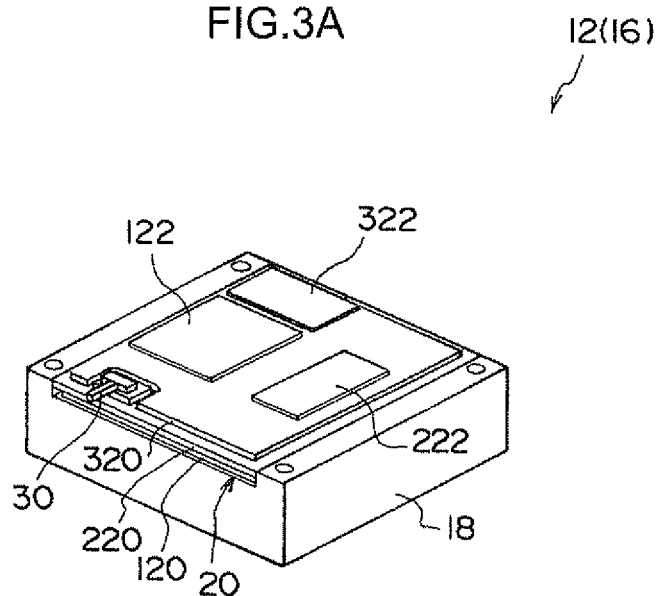
Figure 3B:
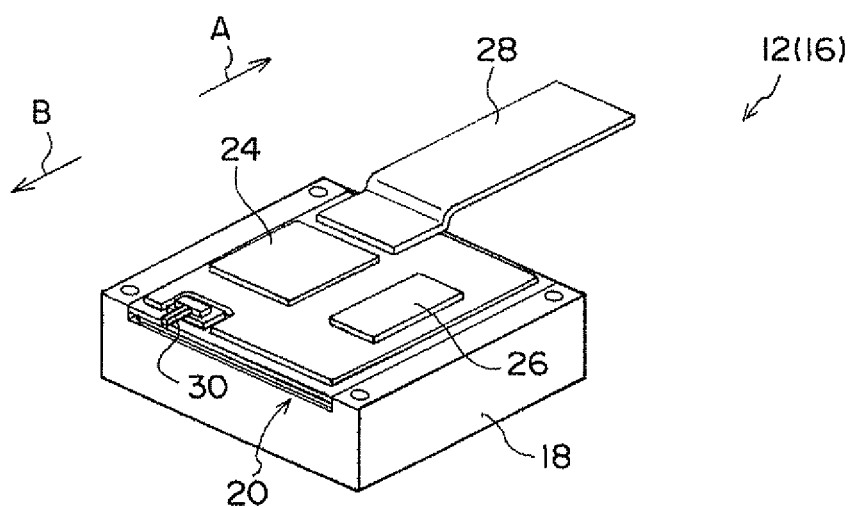

An insulated gate bipolar transistor (IGBT) element 24 that serves as a first power device, a diode 26, and a first output electrode 28 at an AC side used for one of UVW phases are disposed on the first substrate 20 via soldering layers 122, 222, and 322 that are shown FIG. 3A. That is, the IGBT element 24, the diode 26, and the first output electrode 28 that are shown in FIGS. 2 and 3B are soldered to the surface of the first substrate 20.

The IGBT element 24 (an insulating gate type bipolar transistor element) is an element that is used as a switching element. Further, the diode 26 is disposed at a position separated from the IGBT element 24. The semiconductor device 16 is configured to convert direct current into alternating current by the IGBT device 24 and the diode 26.

The first output electrode 28 is configured with a rectangular plate-shape in a planar view and is made of a conductive material (metal material; in the first exemplary embodiment, for example, copper (Cu)). The first output electrode 28 is connected to a circuit (not shown) to which the IGBT element 24 and the diode 26 are connected and extends from the first substrate 20 in a predetermined direction along a plate surface direction of the first substrate 20. The direction to which the first output electrode 28 extends is shown by arrow A in the drawings. A first gate electrode 30, which is the gate electrode of the IGBT element 24, extends in a direction (different direction shown by arrow B) that is opposite to the first output electrode 28 along the plate surface direction of the first substrate 20 from above the first substrate 20.

Figure 4A:
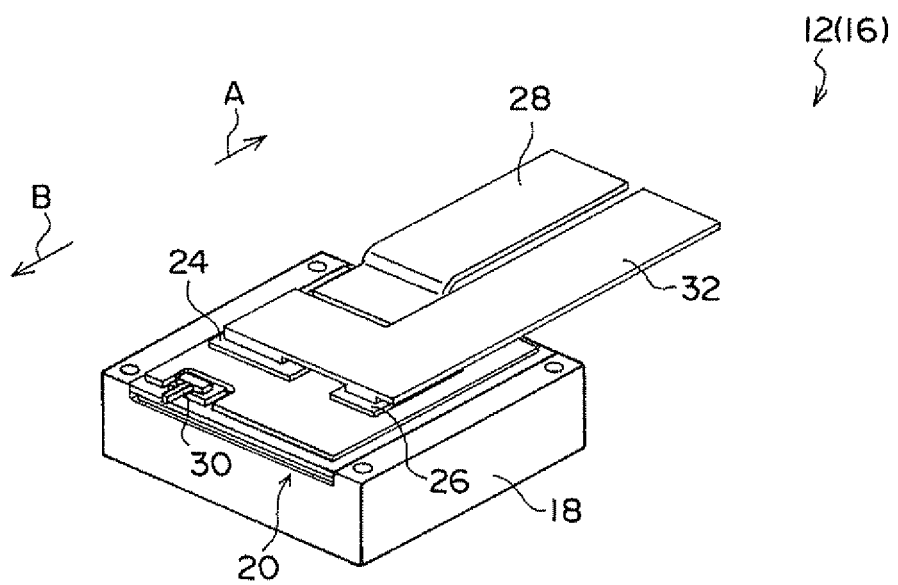

As shown in FIGS. 2 and 4A, an N electrode 32 (a first extending electrode of one of the P electrode or the N electrode) is disposed on the IGBT element 24 and the diode 26. The N electrode 32 is a plate-shaped wiring having an L-shape in a planar view and is made of a conductive material (metal material; in the first exemplary embodiment, copper (Cu) for example) and is bonded to the IGBT element 24 and the diode 26 by soldering. A solder having a melting point lower than a solder for bonding the IGBT element 24 is used as the solder for bonding the N electrode 32. Material for the soldering is not limited to tin-based solder materials containing tin (Sn), but proper materials may be used that do not damage the product (a bonding structure) formed at the previous process. Further, the top side and the bottom side of both of the IGBT element 24 and the diode 26 may be simultaneously soldered, and the same solder material may be used.

The N electrode 32 is connected to the circuit (not shown) to which the IGBT element 24 and the diode 26 are connected by being bonded to the IGBT element 24 and the diode 26, extends from the first substrate 20 in a direction (the different direction) that is opposite to the first gate electrode 30 along the plate surface direction of the first substrate 20, and is connected to a low potential side (one side) of a DC power supply which is not shown. As described above, the N electrode 32 extends in the same direction (the arrow A direction) as that of the first output electrode 28, and the extending portion is disposed parallel to the first output electrode 28 in a planar view.

Figure 4B:
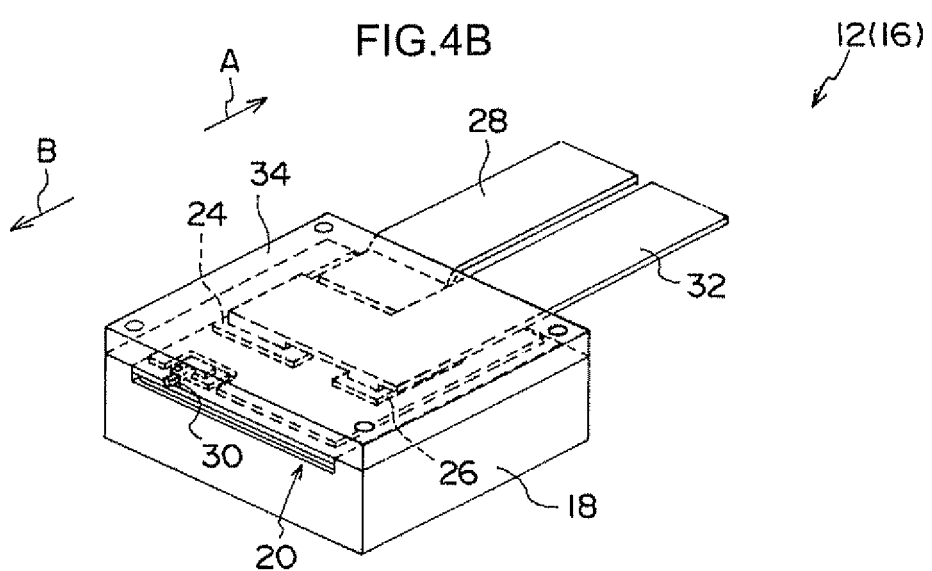

As shown in FIGS. 2 and 4B, components (the first substrate 20, IGBT element 24, diode 26, first output electrode 28, and N electrode 32) disposed on the first cooler 18 are molded by an epoxy resin (see FIG. 4B). In FIG. 4B, a mold portion is represented by reference numeral 34. Although the mold portion is formed in the first exemplary embodiment, a configuration in which the mold portion 34 is not formed may be employed.

The first arm 12 is configured as described above. The second arm 14 shown at the right side of FIG. 2 has the same structure as the first arm 12. Therefore, in the drawings, portions in the second arm 14 that are the same as in the first arm 12 are is represented by suffixing A to the reference numerals showing the corresponding portion of the first arm 12, and descriptions thereof are partially omitted. However, since the second arm 14 forms a portion different from the first arm 12 and provides different functions as the components of the semiconductor device 16, names and functions of the portions will separately be described below as needed.

The second arm 14 is turned over from the state shown in FIG. 2 without changing the extending direction of a second gate electrode 30A (to be described below) so as to be stacked on the first arm 12. Although not shown in the drawings, a terminal of a refrigerant is attached to a second cooler 18A of the second arm 14 in the final step of the manufacturing process of the second arm 14.

The second arm 14 includes a second substrate 20A that is disposed opposite to the first substrate 20. An IGBT element 24A that serves as a second power device is disposed on the second substrate 20A. The second gate electrode 30A, which is the gate electrode of the IGBT element 24A, extends in the same direction as the first gate electrode 30 from the second substrate 20A (see FIG. 1).

A second output electrode 32A at an AC side which is for one of UVW phases extends in the same direction as the first output electrode 28 from the second substrate 20A and is electrically connected to the first output electrode 28 (see FIG. 1). The second output electrode 32A is connected to the circuit (not shown) to which the IGBT element 24A and the diode 26A are connected by being bonded to the IGBT element 24A and the diode 26A. Further, while a P electrode 28A of the semiconductor device 16 (as a second extending electrode of the other one of the P electrode or the N electrode) is connected to the circuit (not shown) to which the IGBT element 24A and the diode 26A are connected, extends in the same direction as the N electrode 32 from the second substrate 20A so as to be disposed opposite to the N electrode 32 in an insulating state (see FIG. 1), and is connected to a high potential side (the other side) of the DC power supply (not shown).

From the above description, as shown in FIG. 1, the P electrode 28A, the N electrode 32, the first output electrode 28, and the second output electrode 32A extend in the same direction (the arrow A direction).

Further, a tip end (a free end far from the first cooler 18) of the first output electrode 28 and a tip end (a free end far from the second cooler 18A) of the second output electrode 32A are urged in a direction approaching each other in the vertical direction. In other words, the first output electrode 28 and the second output electrode 32A also function as plate springs.

Further, by setting the sizes of the first output electrode 28 and the second output electrode 32A relatively large, it is advantageous in that the first output electrode 28 and the second output electrode 32A can receive a larger amount of heat from the IGBT elements 24 and 24A (see FIG. 2) (i.e., also can function as heat mass) when a large heat load is transiently generated, such as when a motor starts.

Figure 5:
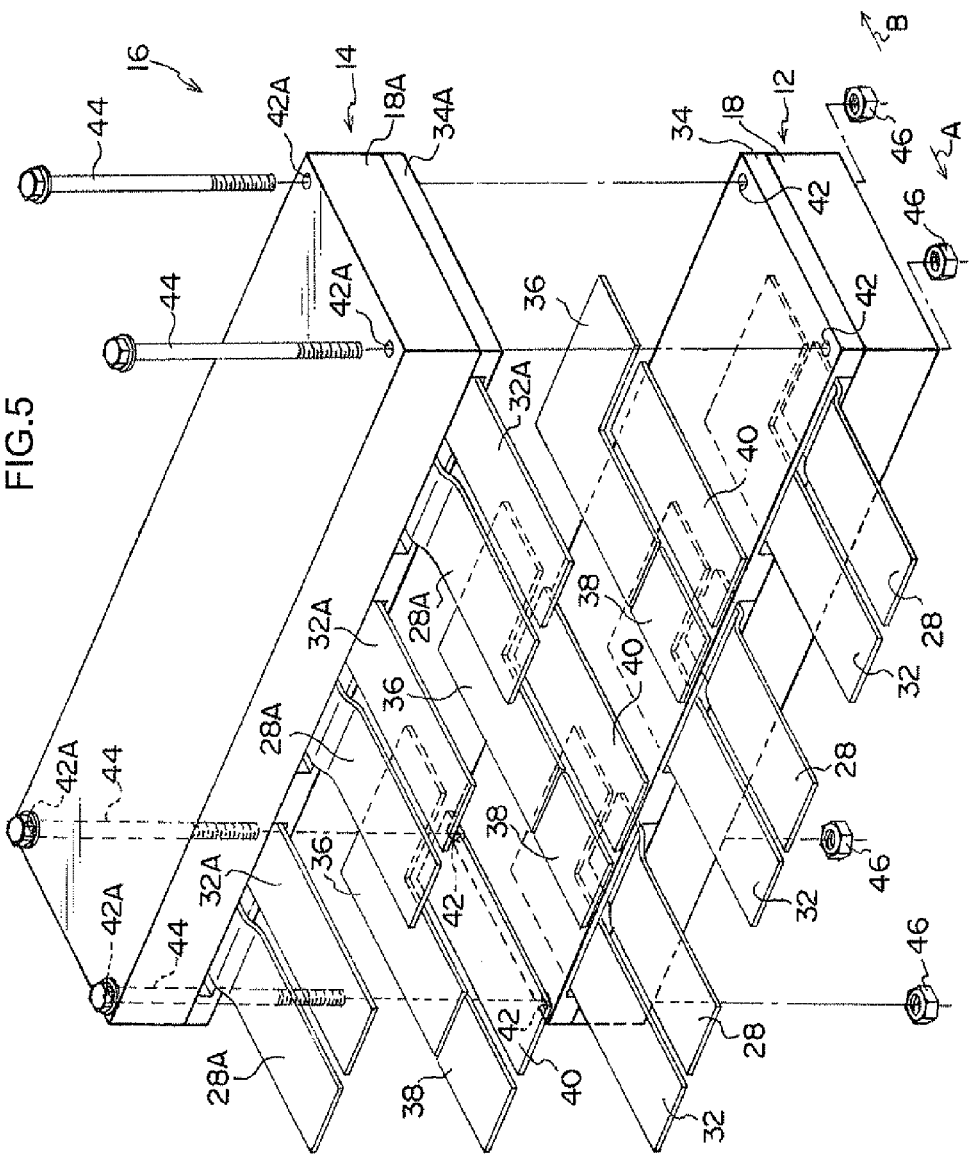
FIG. 5 is an exploded perspective view in which the semiconductor device according to the first exemplary embodiment is viewed from an electrode extending side.
Figure 6:
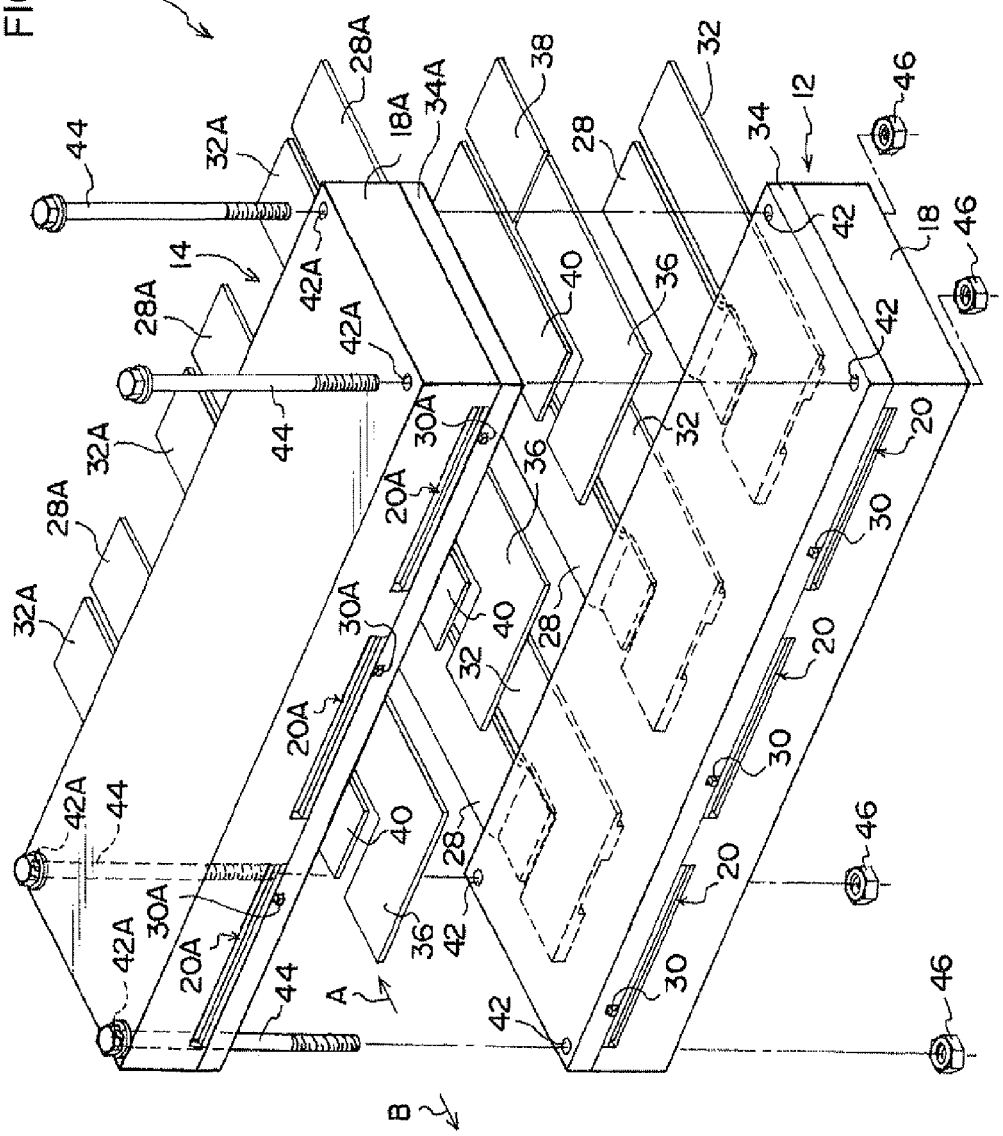
FIG. 6 is an exploded perspective view in which the semiconductor device according to the first exemplary embodiment is viewed from a gate extending side.

FIG. 5 shows an exploded perspective view in which the semiconductor device 16 is viewed from the electrode extending side (a connection side with an external wiring), and FIG. 6 shows an exploded perspective view in which the semiconductor device 16 is viewed from the gate extending side.

As shown in FIGS. 5 and 6, an insulating film 36, a small-capacity capacitor 38, and a foamed metal 40 (foamed copper in the first exemplary embodiment) which serves as a conductive member are sandwiched between the first arm 12 and the second arm 14. The insulating film 36 is an insulating layer made of polymer and is disposed on a portion of the N electrode 32 at a base end side. The capacitor 38 is a sheet member made of a strontium titanate-based ($SrTiO_3$) material as a main component and is disposed on a portion of the N electrode 32 further toward the tip end side (the free end side far from the first cooler 18) than the insulating film 36 and is soldered to the N electrode 32. It is preferable that the capacitor 38 is disposed in the vicinity of the IGBT elements 24 and 24A and is disposed closer to the IGBT elements 24 and 24A than the insulating film 36, from the viewpoint of efficiently reducing the surge voltage generated at the time of the switching operation of the IGBT elements 24 and 24A (see FIG. 2). Therefore, all or a portion of the positions of the capacitor 38 and the insulating film 36 may be replaced. The foamed metal 40 is configured to have substantially the same shape as the first output electrode 28 and is disposed on the first output electrode 28 so as to electrically connect the first output electrode 28 and the second output electrode 32A by being plastically or elastically deformed. That is, the foamed metal 40 is sandwiched between the first output electrode 28 and the second output electrode 32A (see FIG. 1).

Figure 7:
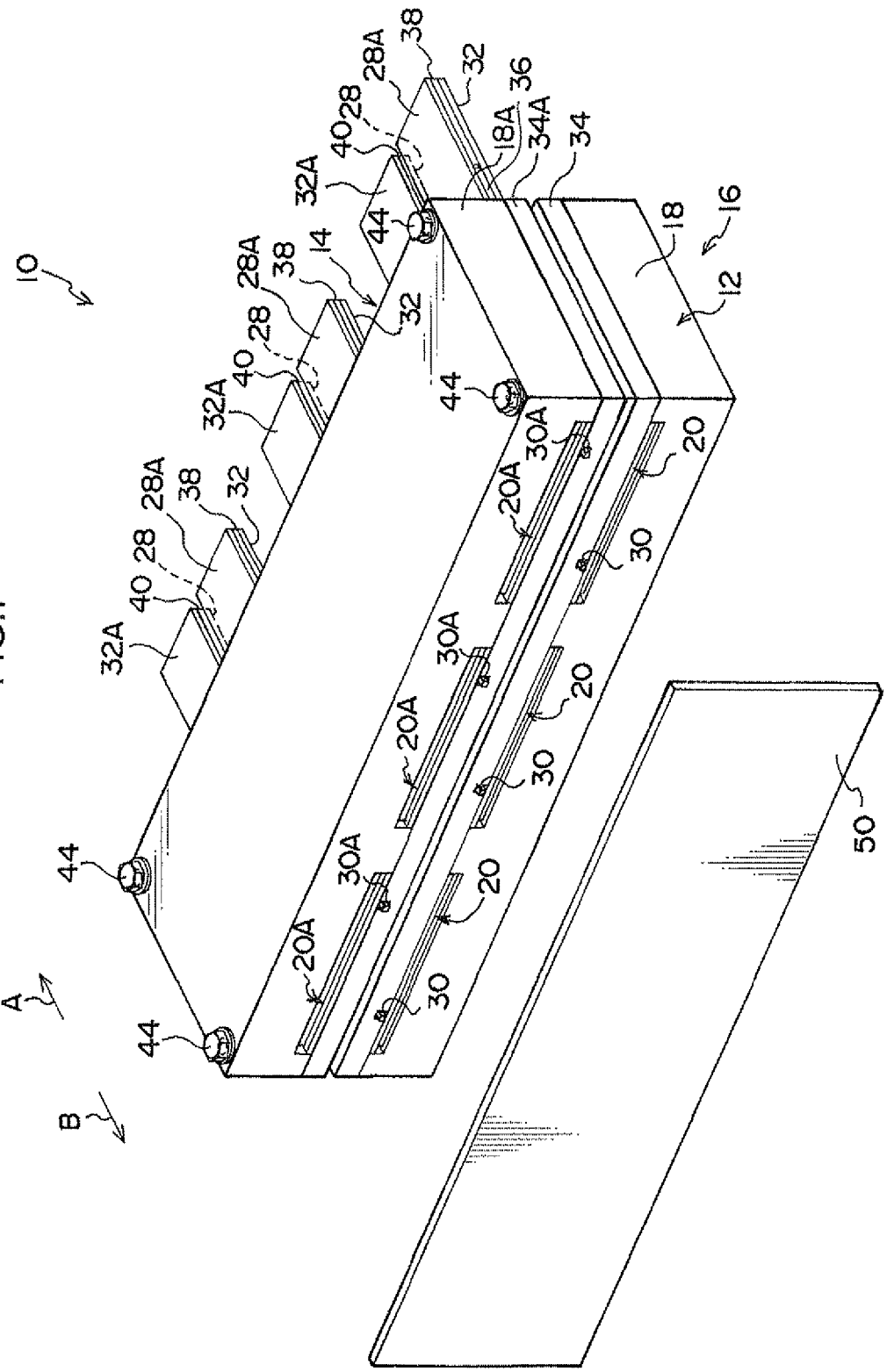
FIG. 7 is an exploded perspective view showing a state before a gate driving circuit board is assembled to the semiconductor device according to the first exemplary embodiment.

The first arm 12 and the second arm 14 are integrated by bolts 44, which penetrate through bolt insertion holes 42 and 42A formed at four corners of the first arm 12 and the second arm 14, screwed with nuts 46. Although a circuit configuration is not shown, the semiconductor device 16 formed of the first arm 12 and the second arm 14 includes a known inverter circuit that includes the P electrode 28A, the N electrode 32, the first output electrode 28, the second output electrode 32A, the IGBT elements 24 and 24A (see FIG. 2), and the diodes 26 and 26A (see FIG. 2). Wiring patterns (not shown) configuring a portion of the inverter circuit are formed at the first substrate 20 and the second substrate 20A shown in FIG. 6. FIG. 7 shows the semiconductor device 16 in a state of being separated from a gate driving circuit board 50 to be attached to the semiconductor device 16.

The gate driving circuit board 50 is disposed so as to be facing the semiconductor device 16 at the side to which the first gate electrode 30 and the second gate electrode 30A extend (see FIG. 1). In other words, the gate driving circuit board 50 is disposed so that the surface of the gate driving circuit board 50 is perpendicular to the extending direction of the first gate electrode 30 and the second gate electrode 30A of the IGBT elements 24 and 24A (see FIG. 2). The gate driving circuit formed on the gate driving circuit board 50 is electrically connected to the first gate electrode 30 and the second gate electrode 30A and performs a gate driving control by supplying a bias voltage to the first gate electrode 30 and the second gate electrode 30A.

Next, the operation of the first exemplary embodiment will be described.

As shown in FIG. 1, in the power module 10 according to the first exemplary embodiment, the P electrode 28A and the N electrode 32 extend in the same direction (the arrow A direction) and are disposed facing each other in an insulating state due to the interposition of the insulating film 36 (see FIG. 6). Therefore, currents in opposite directions pass through the P electrode 28A and the N electrode 32 which generate magnetic fields having opposite directions. These magnetic fields cancel each other and generate the mutual inductance that reduces the parasitic inductance. For this reason, the IGBT elements 24 and 24A (see FIG. 2) can be driven at high speed, and it is possible to reduce the loss at the time of the switching. Further, the surge voltage generated at the time of the switching is partially absorbed by the capacitor 38.

For example, in a comparison structure in which plural three-phase AC power devices are disposed on one cooler, a connection from a main wiring (a bus bar to which direct current is supplied) to an electrode or a wire bond on an insulating substrate is long, and a predetermined amount of relatively large parasitic inductance is generated on the wiring. For this reason, in this comparison structure, the surge voltage will be large when the power device is switched, which may affect the power device or the implementation thereof, or may radiate noise. Such behavior will be remarkable particularly at the time of the high-speed switching, which may obstruct the advantage of high-speed characteristics of the power device. In contrast, the power module 10 according to the first exemplary embodiment can address the above problems.

Further, the first gate electrode 30 and the second gate electrode 30A extend in the same direction (the arrow B direction) and extend in the direction that is different from the extending direction (the arrow A direction) of the P electrode 28A, the N electrode 32, the first output electrode 28, and the second output electrode 32A. Therefore, the gate driving circuit board 50 can be disposed at the side to which the first gate electrode 30 and the second gate electrode 30A extend so as to be facing the semiconductor device 16. In other words, the gate driving circuit (not shown) formed on the gate driving circuit board 50 is connected to the first gate electrode 30 and the second gate electrode 30A in the state in which the gate driving circuit is disposed physically close to the first gate electrode 30 and the second gate electrode 30A. Accordingly, the wiring length connecting between the first gate electrode 30 and the second gate electrode 30A and the gate driving circuit (not shown) is short, and the parasitic inductance is reduced. As a result, a rising time of a driving signal is short, such that it is advantageous in the high-speed switching. Accordingly, the switching may be achieved at a high carrier frequency.

Furthermore, the surface direction of the substrate surface of the gate driving circuit board 50 is disposed vertical to the extending direction of the first gate electrode 30 and the second gate electrode 30A of the IGBT elements 24 and 24A (see FIG. 2). Therefore, the magnetic field generated at the first gate electrode 30 and the second gate electrode 30A substantially does not cross the gate driving circuit (not shown) of the gate driving circuit board 50, and thereby an influence of noise to the gate driving circuit can be suppressed.

Here, results of an experiment for confirming the effects of the first exemplary embodiment will be described. In the experiment, the power module 10 according to the first exemplary embodiment and a power module according to a comparative example were operated respectively as inverters, and the loss, the surge voltage, and the highest temperature of the power devices (the IGBT elements 24 and 24A in the power module 10) were measured. A power module having a conventional planner structure in which plural power devices are aligned on one cooler is employed as the power module of the comparative example.

In the power module of the comparative example, as a result of measuring the loss by changing the carrier frequency, a ratio of the steady loss and the switching loss at 5 kHz was 1:1. The surge voltage at the time of being turned-off was 100 V with respect to the power supply voltage. Further, as a result of measurement of the temperature of the power devices when the temperature of the power devices rises such as at the time of motor starting, the highest temperature of the power devices was 140° C. In this regard, when a part of the power devices transiently generates large heat within a short time, for example at the time of the motor starting, since there is a time lag (i.e., since a time constant is long) until a heat-removal mechanism such as cooling water functions, it is difficult to obtain the cooling effect rapidly and the temperature of the power device rises high.

In contrast, as a result of similar measurement with respect to the power module 10 according to the first exemplary embodiment, the ratio of the steady loss and the switching loss was 1:0.2 at 5 kHz, the surge voltage was 30V with respect to the power supply voltage, and the highest temperature was 110° C.

It can be appreciated from the above results that the switching loss and the surge voltage is low in the power module 10 according to the first exemplary embodiment lowers than a commonly-used power module according to the comparative example, which demonstrate high efficiency of the power module 10, and there is also an effect of reducing the temperature of the power device 10 when a high load is applied. Accordingly, the power module 10 can be applied to products with a limited space such as a hybrid car, and exhibits industrial advantages in such applications.

As described above, in the power module 10 according to the first exemplary embodiment can effectively utilize the high-speed characteristic of the IGBT elements 24 and 24A (see FIG. 2).

Further, in the power module 10 according to the first exemplary embodiment, the P electrode 28A, the N electrode 32, the first output electrode 28, and the second output electrode 32A extend in the same direction (the arrow A direction). For this reason, the entire configuration can be made compact (in small size).

Further, in the power module 10 according to the first exemplary embodiment, the foamed metal 40 electrically connecting the first output electrode 28 to the second output electrode 32A is sandwiched between the first output electrode 28 and the second output electrode 32A in a plastic deformed or elastic deformed state. Therefore, variations in the height direction of the first output electrode 28 and the second output electrode 32A that are vertically stacked (i.e., variations in the thickness of the mounting part caused in the mounting process) are compensated for. Furthermore, since the first output electrode 28 and the second output electrode 32A function as plate springs as described above, the foamed metal 40 is always be sandwiched between the first output electrode 28 and the second output electrode 32A by being applied a predetermined load. As a result, the electrical contact state between the first output electrode 28 and the second output electrode 32A using the foamed metal 40 can be stably maintained.

An additional effect obtained by disposition of the foamed metal 40 and the plate-spring function of the first output electrode 28 and the second output electrode 32A is that the contact heat resistance between the first cooler 18 and the second cooler 18A and the mounting part sandwiched by the first cooler 18 and the second cooler 18A is reduced and the cooling effect of the mounting part may be increased. An effect of relieving the stress between the first arm 12 and the second arm 14 can also be obtained.

In the comparison structure in which the plural three-phase AC power devices are disposed on one cooler, for example, since the entire structure is planar, the electrical wiring or a piping of a refrigerant medium may be uneven across the three phases. When such unevenness exists, the electrical characteristics or heat characteristics of the power device configuring the inverter may be uneven, and the entire performance is determined (rate-controlled) by a portion at which the wiring length or the piping length is maximum, which may be a hindrance to miniaturization of the module or may cause influences such as non-uniform operations. In contrast, due to the power module 10 according to the first exemplary embodiment having a basic structure in which the first arm 12 and the second arm 14 overlap with each other, the foamed metal 40 is interposed therebetween, and the first output electrode 28 and the second output electrode 32A function as plate springs, the unevenness across the three phases can be suppressed.

Further, in the power module 10 according to the first exemplary embodiment, when the power device (the IGBT elements 24 and 24A, see FIG. 2) of any one of the first arm 12 and the second arm 14 fails, it suffice to replace only the broken power device, and there is no need to replace the entire power module.

Second Exemplary Embodiment

Next, a power module 60 according to a second exemplary embodiment of the present invention is described below with reference to FIGS. 8 to 13. Note that components which are substantially the same as the first exemplary embodiment are denoted by the same reference numerals and descriptions thereof will be omitted.

Figure 8:
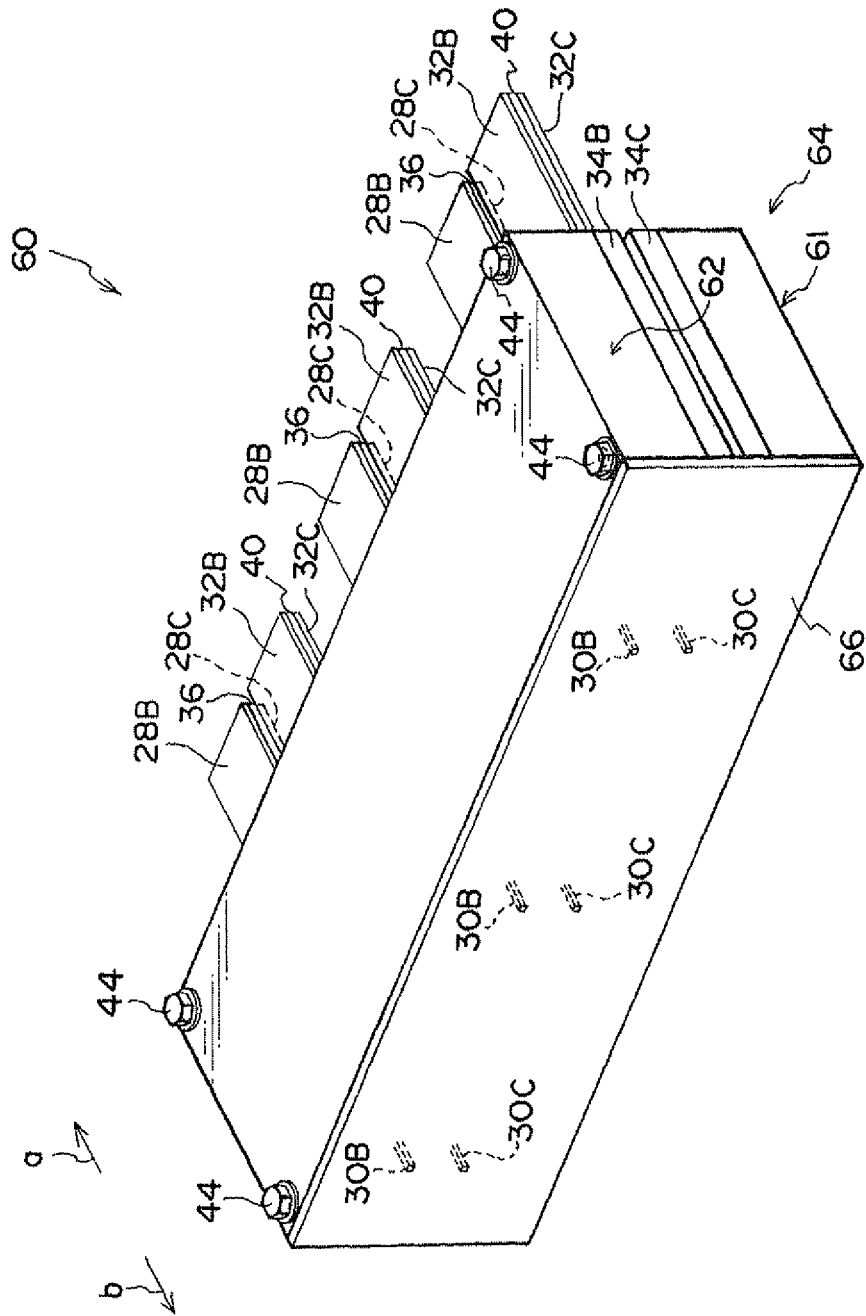
FIG. 8 is an appearance perspective view showing a power module according to a second exemplary embodiment of the present invention.
Figure 9:
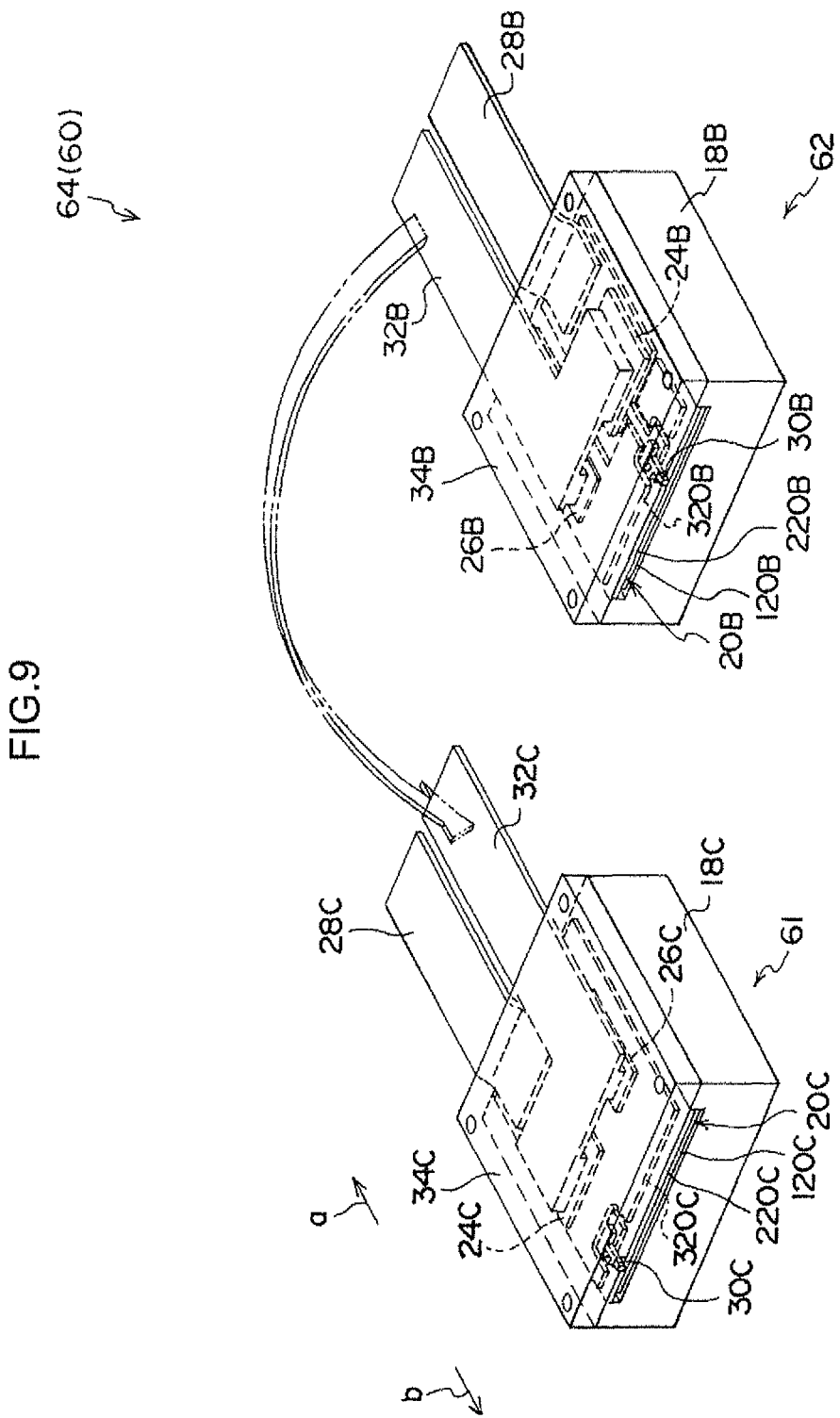
FIG. 9 is an exploded perspective view showing main components of a portion corresponding to one phase of a semiconductor device according to the second exemplary embodiment in a disassembled state.
Figure 13:
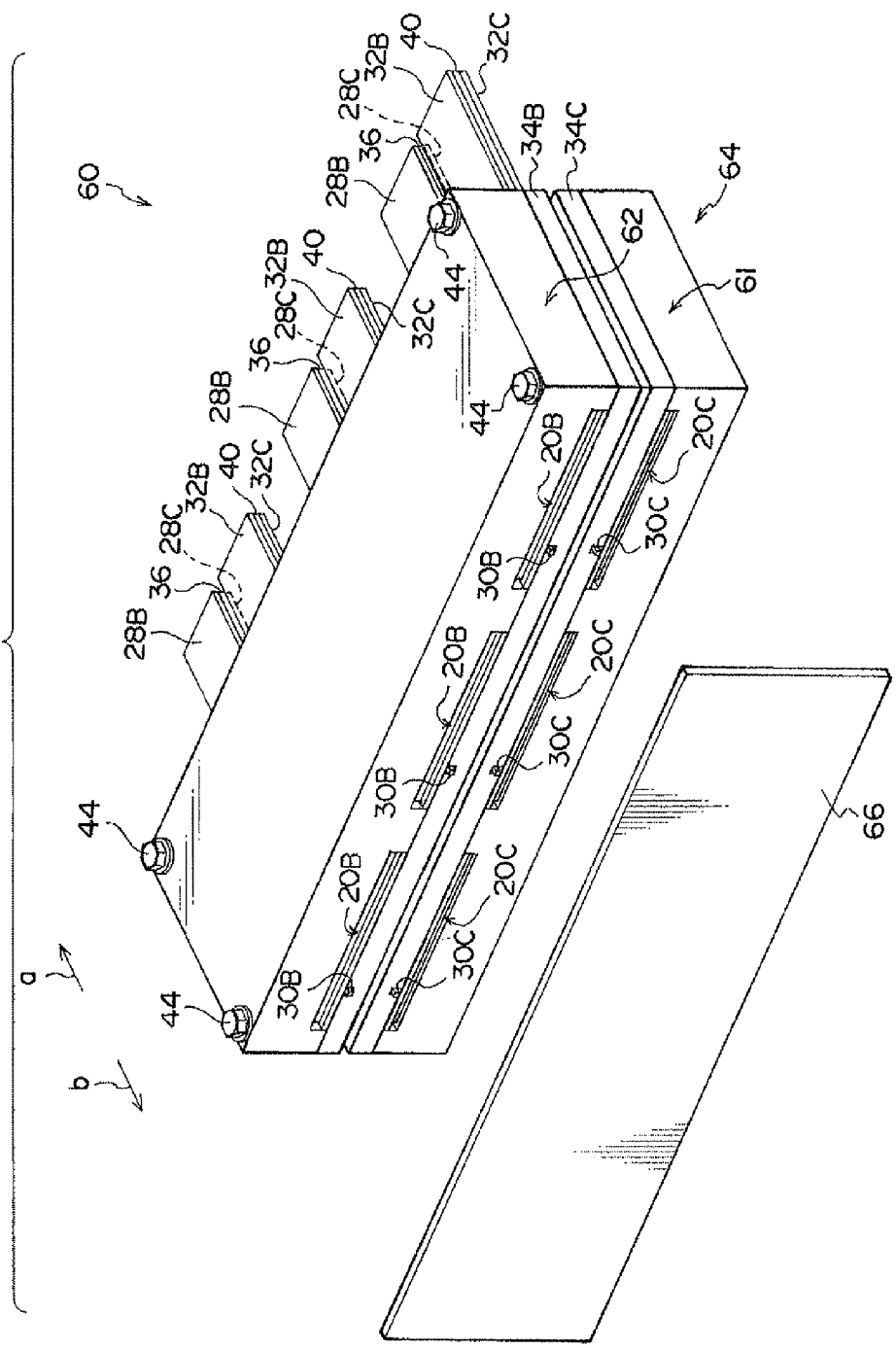
FIG. 13 is an exploded perspective view showing a state before a gate driving circuit board is assembled to the semiconductor device according to the second exemplary embodiment.

FIG. 8 shows an appearance perspective view of the power module 60 and FIG. 9 shows an exploded perspective view of main components of a portion corresponding to one phase of a semiconductor device 64 in the power module 60 in a disassembled state. FIGS. 10A-10B and FIGS. 11A-11B show a perspective view of a sequence of a manufacturing process of a second arm 62 in this order. FIG. 12 shows an exploded perspective view in which the semiconductor device 64 is viewed from the gate extending side and FIG. 13 shows a state before a gate driving circuit board 66 is assembled with the semiconductor device 64.

A first arm 61 shown at the left side of FIG. 9 has the same structure as the first arm 12 (see FIG. 2) in the first exemplary embodiment. Therefore, in FIG. 9, portions in the first arm 61 that are the same as in the first arm 12 (see FIG. 2) are represented by suffixing C to the reference numerals showing the corresponding portion of the first arm 12 and descriptions thereof are partially omitted. However, since the first arm 61 performs functions partially different from those of the first arm 12 (see FIG. 2), in the following description, names and functions of each portion will be separately described as needed.

As shown in FIG. 9, an IGBT element 24C which serves as a first power device and a diode 26C is disposed on a first substrate 20C in the first arm 61. A P electrode 28C (a first extending electrode of one of a P electrode or an N electrode) of the semiconductor device 64, extends from the first substrate 20C along the plate surface direction of the first substrate 20C. A direction in which the P electrode 28C extends is shown as an arrow a direction in the drawings. The P electrode 28C is connected to a circuit (not shown) to which the IGBT element 24C and the diode 26C are connected and is connected to a high potential side (one side) of a DC power supply (not shown).

A first gate electrode 30C, which is the gate electrode of the IGBT element 24C, extends from the first substrate 20C in a direction (arrow b direction) that is opposite to (different from) that of the P electrode 28C along the plate surface direction of the first substrate 20C. Further, the first output electrode 32C extends from the first substrate 20C in a direction (the arrow a direction) that is opposite to (different from) that of the first gate electrode 30C along the plate surface direction of the first substrate 20C. A first output electrode 32C at an alternating current output side used for one of UVW phases is connected to the circuit (not shown) to which the IGBT element 24C and the diode 26C are connected by being bonded to the IGBT element 24C and the diode 26C by soldering.

The semiconductor device 64 of the power module 60 includes the first arm 61 and the second arm 62. The arrangement of each components of the second arm 62 is substantially symmetrical in a planar view with respect to the arrangement of each components of the first arm 61 in the state shown in FIG. 9. In FIG. 9, portions in the second arm 62 which are similar to the first arm 61 are represented by suffixing B instead of C to the reference numerals showing the corresponding portions of the first arm 61 and descriptions thereof are partially omitted. Since the second arm 62 forms a portion different from the first arm 61 and performs different functions as the components of the semiconductor device 64, in the following description, names and functions of each portions will be separately described below as needed.

The second arm 62 is turned over from the state shown in FIG. 9 without changing the extending direction of a second gate electrode 30B (to be described below) so as to be stacked on the first arm 61. Although not shown, a terminal of a refrigerant is attached to a second cooler 18B of the second arm 62 in the final step of the manufacturing process of the second arm 62.

Figure 10A:
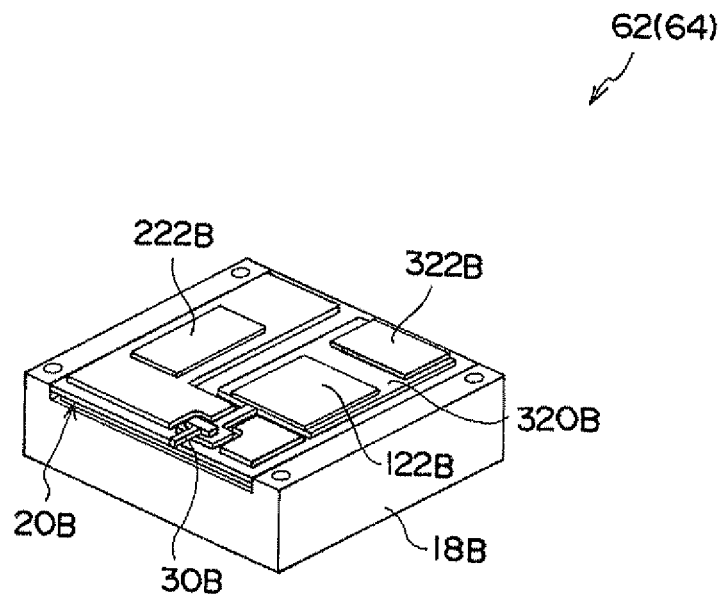
Figure 10B:
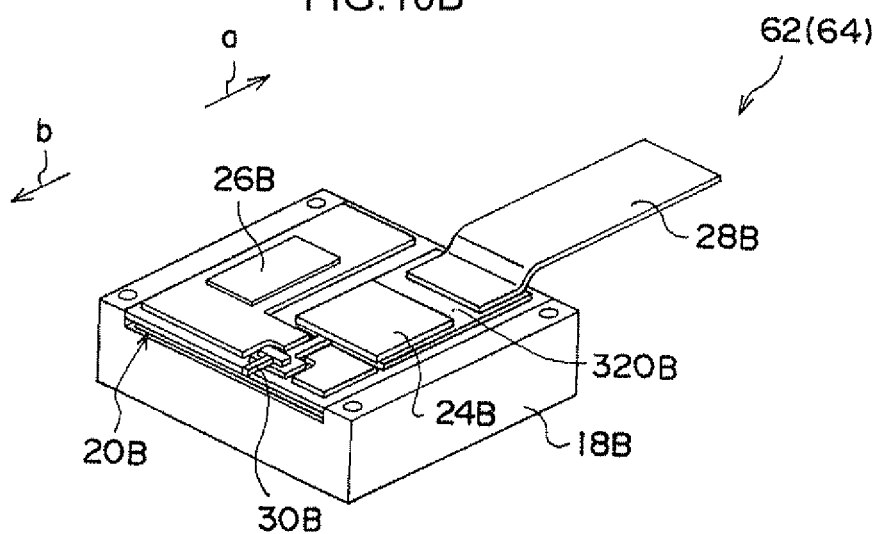

The second arm 62 includes a second substrate 20B that is disposed so as to be facing the first substrate 20C. As shown in FIG. 10B, an IGBT element 24B which serves as the second power device is disposed on the second substrate 20B by soldering. A second gate electrode 30B which is the gate electrode of the IGBT element 24B extends in the same direction (the arrow b direction) as that of the second gate electrode 30 from the second substrate 20B.

Figure 11A:
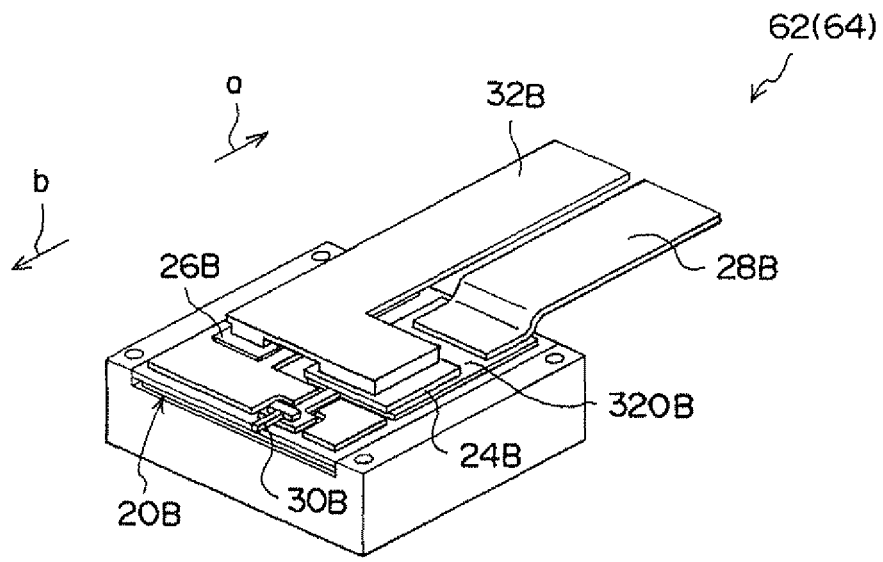
Figure 11B:
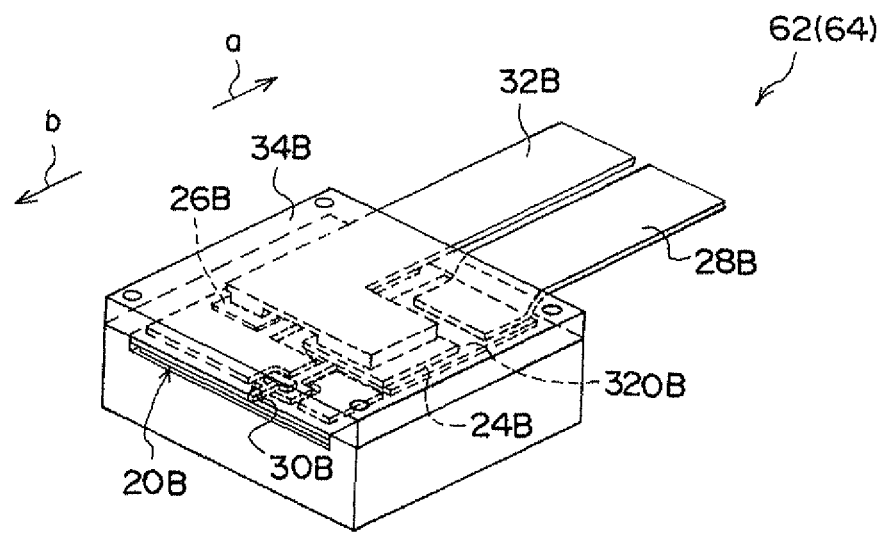

An N electrode 28B of the semiconductor device 64 (the second extending electrode of the other one of the P electrode or the N electrode) extends in the same direction (the arrow a direction) as the P electrode 28C shown in FIG. 12 from the second substrate 20B of FIGS. 11A and 11B, and disposed so as to be facing the P electrode 28C in an insulating state (see FIG. 8). The N electrode 28B shown in FIGS. 11A and 11B is connected to the circuit (not shown) to which the IGBT element 24B and the diode 26B are connected, and is connected to the low potential side (the other side) of the DC power supply (not shown). A second output electrode 32B at the alternating current output side used for one of UVW phases is connected to the circuit (not shown) to which the IGBT element 24B and the diode 26B are connected by being bonded to the IGBT element 24B and the diode 26B. The second output electrode 32B extends in the same direction as the first output electrode 32C shown in FIG. 12 from the second substrate 20B so as to be electrically connected to the first output electrode 32C (see FIG. 8).

As described above and shown in FIG. 8, the P electrode 28C, the N electrode 28B, the first output electrode 32C, and the second output electrode 32B extend in the same direction (in the arrow a direction).

Further, as shown in FIG. 12, a tip end 32C (a free end far from the first cooler 18) of the first output electrode 32C and a tip end (a free end far from the second cooler 18B) of the second output electrode 32B are urged in a direction approaching to each other in the vertical direction. In other words, the first output electrode 32C and the second output electrode 32B also function as plate springs. The foamed metal 40 is sandwiched between the first output electrode 32C and the second output electrode 32B. Although a circuit configuration is not shown, the semiconductor device 64 formed of the first arm 61 and the second arm 62 includes a known inverter circuit configured that includes the P electrode 28C, the N electrode 28B, the first output electrode 32C, the second output electrode 32B, the IGBT elements 24C and 24B (see FIG. 9), and the diodes 26C and 26B (see FIG. 9). Wiring patterns (not shown) configuring portions of the inverter circuit are formed at the first substrate 20C and the second substrate 20B.

As shown in FIG. 13, the gate driving circuit board 66 is disposed at the side to which the first gate electrode 30C and the second gate electrode 30B extend so as to be facing the semiconductor device 64 (see FIG. 8). The gate driving circuit (not shown) that is electrically connected to the first gate electrode 30C and the second gate electrode 30B is formed on the gate driving circuit board 66. The gate driving circuit performs the gate driving control by supplying a bias voltage to the first gate electrode 30C and the second gate electrode 30B.

The same operation and effects as in the first exemplary embodiment can also be obtained by the configuration of the above-described second exemplary embodiment.

Third Exemplary Embodiment

Next, a power module 70 according to a third exemplary embodiment of the present invention is described below with reference to FIGS. 14 to 17. Note that components which are substantially the same as those in the first exemplary embodiment are denoted by the same reference numerals and descriptions thereof will be omitted.

Figure 14:
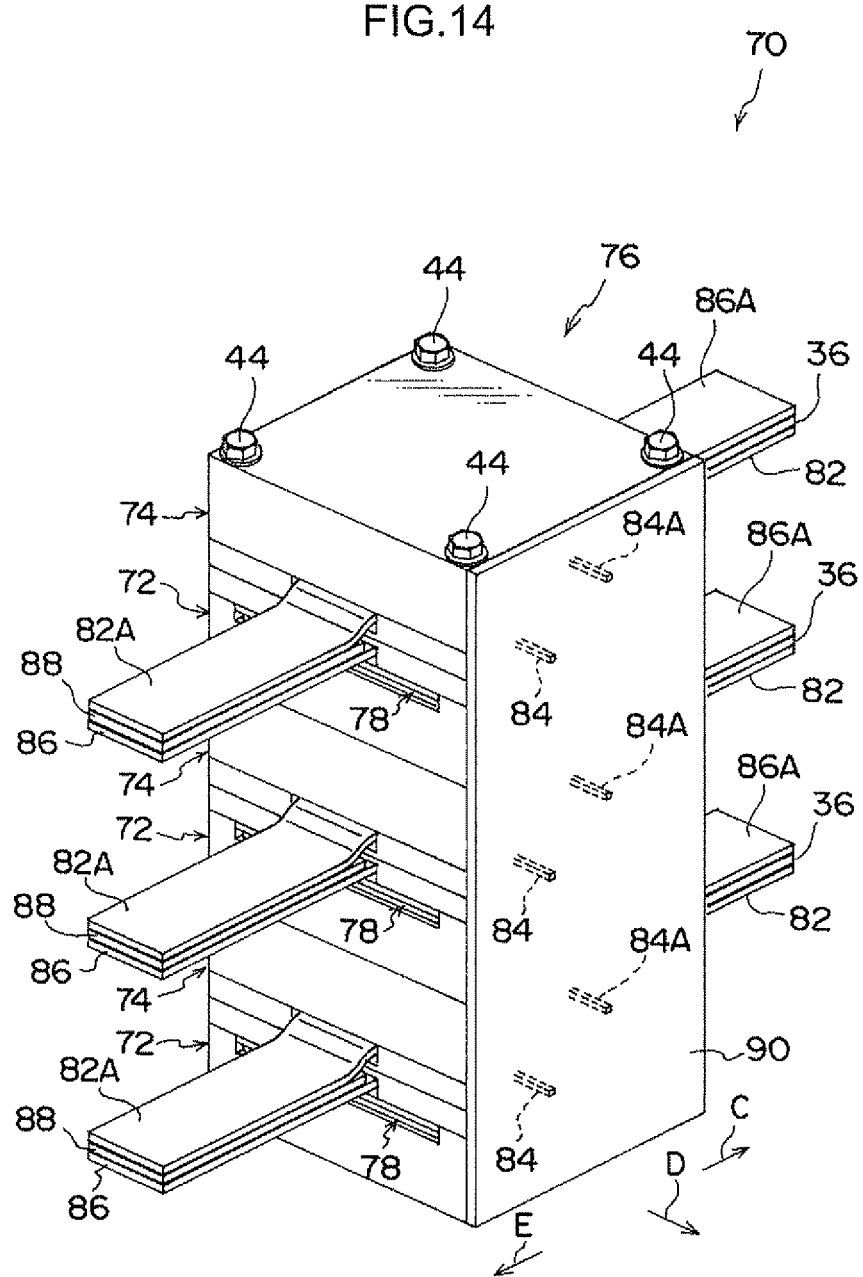
FIG. 14 is an appearance perspective view showing a power module according to a third exemplary embodiment of the present invention.
Figure 15:
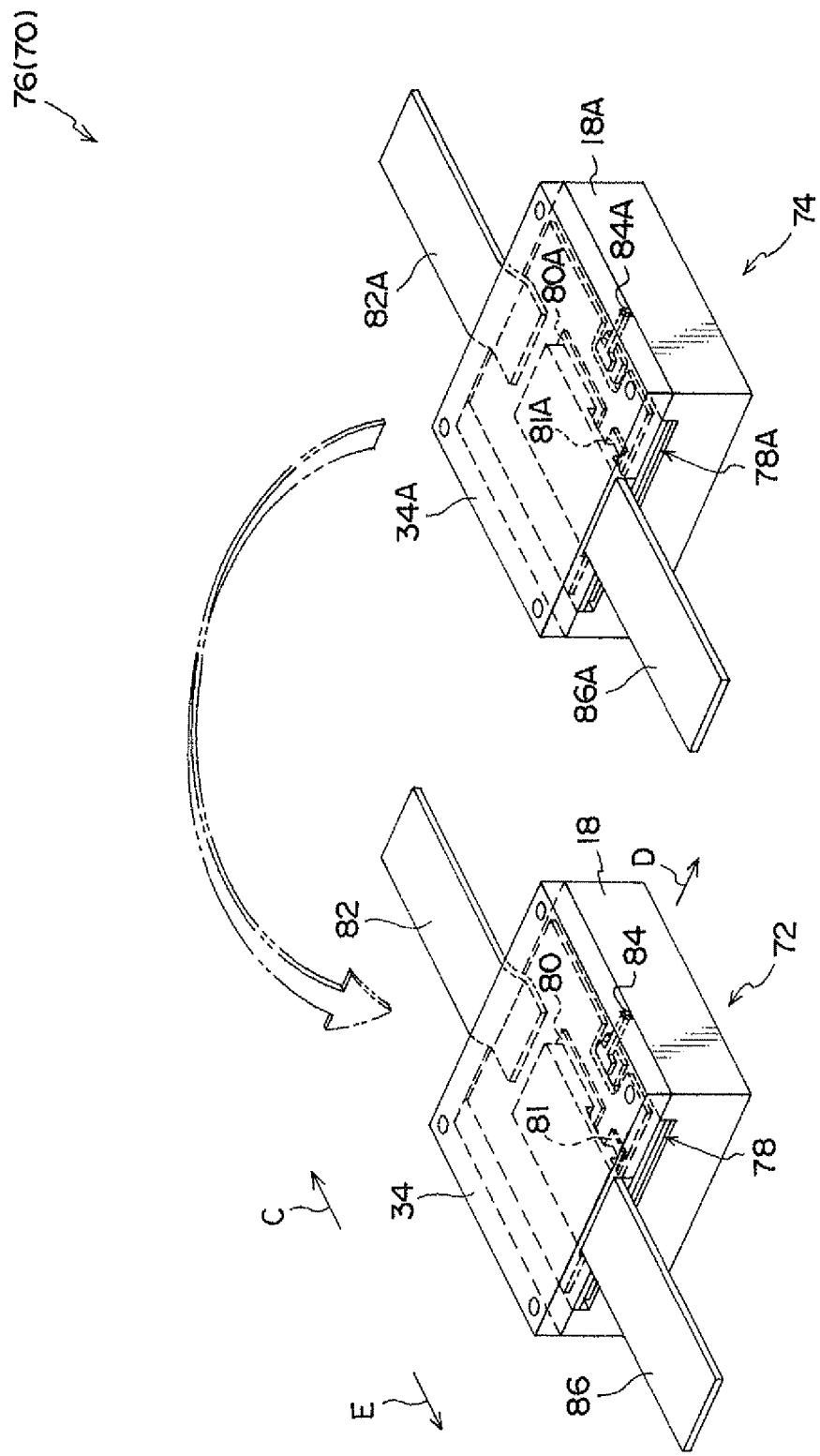
FIG. 15 is an exploded perspective view showing main components of a portion corresponding to one phase of a semiconductor device according to the third exemplary embodiment in a disassembled state.
Figure 16:
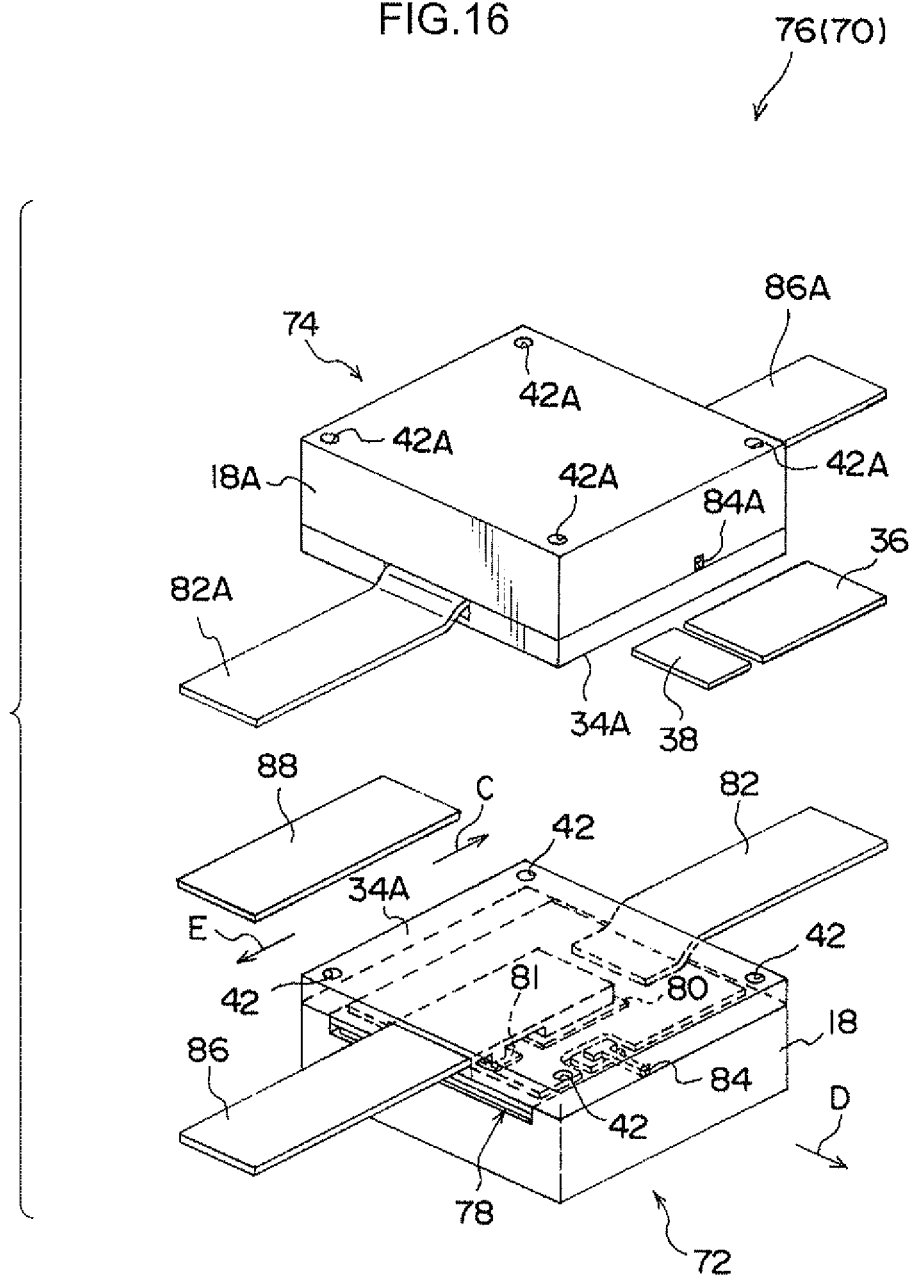
FIG. 16 is an exploded perspective view showing main components of a portion corresponding to one phase of the semiconductor device according to the third exemplary embodiment.

FIG. 14 shows an appearance perspective view of the power module 70 and FIG. 15 shows an exploded perspective view of main components of a portion corresponding to one phase of a semiconductor device 76 in the power module 70 in a disassembled state. FIG. 16 shows another exploded perspective view of a portion corresponding to one phase of the semiconductor device 76 and FIG. 17 shows a state before a gate driving circuit board 90 is assembled with the semiconductor device 76.

As shown in FIG. 14, the semiconductor device 76 includes a first arm 72 and a second arm 74, and has substantially the same functions as the semiconductor device 16 of the first exemplary embodiment.

As shown in FIG. 15, an IGBT element 80 which serves as the first power device is disposed on a first substrate 78 in the first arm 72. A P electrode 82 (a first extending electrode of one of a P electrode or an N electrode) of the semiconductor device 76 extends from the first substrate 78 along the plate surface direction of the first substrate 78. Further, a direction in which the P electrode 82 extends is shown in an arrow C in the drawings. The P electrode 82 is connected to a circuit (not shown) to which the IGBT element 80 and the diode 81 are connected, and is connected to a high potential side (one side) of a DC power supply (not shown).

A first gate electrode 84, which is a gate electrode of the IGBT element 80, extends from the first substrate 78 in a direction (an arrow D direction, which is a direction different from the P electrode 82) orthogonal to the extending direction of the P electrode in a planar view along the plate surface direction of the first substrate 78. In addition, a first output electrode 86 extends from the first substrate 78 in a direction (an arrow E direction, which is a direction different from the first gate electrode 84) opposite to the extending direction of the P electrode 82 in a planar view along the plate surface direction of the first substrate 78. The first output electrode 86 at an alternating current output side used for one of UVW phases is connected to the circuit (not shown) to which the IGBT element 80 and the diode 81 are connected by being bonded to the IGBT element 80 and the diode 81 by soldering.

The second arm 74 has the same structure as the first arm 72. In the drawing, portions in the second arm that are the same as in the first arm 72 are represented by suffixing A to the reference numerals showing the corresponding portion of the first arm 72, and descriptions thereof are partially omitted. However, since the second arm 74 forms a portion different from the first arm 72, and performs different functions as the components of the semiconductor device 76, in the following description, names and functions of each portion will be separately described as needed.

The second arm 74 is turned over from the state shown in FIG. 15 without changing the extending direction of a second gate electrode 84A (to be described below) so as to be stacked on the first arm 72. The second arm 74 includes a second substrate 78A that is facing the first substrate 78. An IGBT element 80A which serves as a second power device is disposed on the second substrate 78A. The second gate electrode 84A, which is a gate electrode of the IGBT element 80A, extends in the same direction (the arrow D direction) as the first gate electrode 84 from the second substrate 78A (see FIG. 16).

As shown in FIG. 16, an N electrode 86A (a second extending electrode of the other one of the P electrode or the N electrode) of the semiconductor device 76 extends in the same direction (the arrow C direction) as the P electrode 82 from the second substrate 78A so as to be facing the P electrode 82 in an insulating state. The N electrode 86A shown in FIG. 15 is connected to the circuit (not shown) to which the IGBT element 80A and the diode 81A are connected by being bonded to the IGBT element 80A and the diode 81A by soldering, and is connected to the low potential side (the other side) of the DC power supply (not shown). Further, while a second output electrode 82A at an alternating current output side used for one of UVW phases is connected to the circuit (not shown) to which the IGBT element 80A and the diode 81A are connected. The second output electrode 82A extends in the same direction (the arrow E direction) as the first output electrode 86 shown in FIG. 14 from above the second substrate 78A so as to be electrically connected to the first output electrode 86.

A foamed metal 88 which serves as a conductive member is sandwiched between the first output electrode 86 and the second output electrode 82A. The foamed metal 88 electrically connects the first output electrode 86 to the second output electrode 82A in a plastic deformed or elastic deformed state.

As shown in FIG. 17, the semiconductor device 76 is configured so that three pairs of the first arm 72 and the second arm 74 are vertically stacked and are fastened by bolts 44 and nuts (not shown). Although a circuit configuration is not shown, the semiconductor device 76 includes a known inverter that includes the P electrode 82, the N electrode 86A, the first output electrode 86, the second output electrode 82A, the IGBT elements 80 and 80A (see FIG. 15), and the diodes 81 and 81A (see FIG. 15). Wiring patterns (not shown) configuring a portion of the inverter circuit are formed at the first substrate 78 and the second substrate 78A shown in FIG. 15.

Further, as shown in FIG. 17, the gate driving circuit board 90 is disposed at the side to which the first gate electrode 84 and the second gate electrode 84A extend so as to be facing the semiconductor device 76 (see FIG. 14). The gate driving circuit board 90 shown in FIG. 14 is formed with the gate driving circuit (not shown) that is electrically connected to the first gate electrode 84 and the second gate electrode 84A. The gate driving circuit performs the gate driving control by supplying a bias voltage to the first gate electrode 84 and the second gate electrode 84A.

The power module 70 according to the third exemplary embodiment described above can also utilize the high-speed characteristic of the IGBT elements 80 and 80A (see FIG. 15).

Modifications of Exemplary Embodiments

In the above-mentioned exemplary embodiments, although the foamed metals 40 and 88 are sandwiched between the first output electrodes 28, 32C, and 86 and the second output electrodes 32A, 32B, and 82A as the conductive member, embodiments are not limited to this. A gathering of fine metal wires (for example, in an entwined state) may be applied as the conductive member instead of the foamed metals 40 and 88. Alternately, a configuration may be employed in which the first output electrode and the second output electrode directly contact with each other without interposing the conductive member.

The conductive member that electrically connects the first output electrode to the second output electrode may be sandwiched, for example, between the first output electrode and the second output electrode in the plastic deformed state, may be sandwiched between the first output electrode and the second output electrode in the elastic deformed state, or may be sandwiched between the first output electrode and the second output electrode in the state in which having both a plastic deformed portion and an elastic deformed portion. Alternately, for example, a first conductive member sandwiched between the first output electrode and the second output electrode in the plastic deformed state and a second conductive member sandwiched between the first output electrode and the second output electrode in the elastic deformed state may be used in combination.

Further, although the above-mentioned exemplary embodiments describes, by way of example, the cases in which the IGBT elements are used as the first power device and the second power device, embodiments are not limited to this and other power devices such as a thyristor may be used as the first power device and the second power device may also be.

What is claimed is:
1. A power module comprising:
a semiconductor device comprising
  a first arm including
    a first substrate,
    a first power device disposed on the first substrate,
    a first extending electrode, of one of a P electrode or an N electrode, extending from the first substrate along a plate surface direction of the first substrate, the first extending electrode being connected to a circuit to which the first power device is connected, and being connected to one side of a DC power supply,
    a first gate electrode that is a gate electrode of the first power device, the first gate electrode extending from the first substrate in a direction different from the first extending electrode along the plate surface direction of the first substrate, and
    a first output electrode extending from the first substrate in a direction different from the first gate electrode along the plate surface direction of the first substrate, and being connected to the circuit to which the first power device is connected, and
  a second arm that is stacked on the first arm, including
    a second substrate facing the first substrate,
    a second power device disposed on the second substrate,
    a second extending electrode, of the other one of the P electrode or the N electrode, extending from the second substrate in a same direction as the first extending electrode so as to be facing the first extending electrode in an insulating state, the second extending electrode being connected to a circuit to which the second power device is connected, and being connected to the other side of the DC power supply,
    a second gate electrode that is a gate electrode of the second power device, extending from the second substrate in the same direction as the first gate electrode, and
    a second output electrode extending from the second substrate in the same direction as the first output electrode so as to be electrically connected to the first output electrode, the second output electrode being connected to the circuit to which the second power device is connected; and a gate driving circuit board that is disposed at a side to which the first gate electrode and the second gate electrode extend so as to be facing the semiconductor device, the gate driving circuit board comprising a gate driving circuit that is electrically connected to the first gate electrode and the second gate electrode and that supplies a bias voltage to the first gate electrode and the second gate electrode.

2. The power module of claim 1, wherein the first extending electrode, the second extending electrode, the first output electrode, and the second output electrode extend in the same direction.

3. The power module of claim 1, wherein the semiconductor device comprises a conductive member that electrically connects the first output electrode and the second output electrode by being sandwiched between the first output electrode and the second output electrode in at least one of a plastically deformed state or an elastically deformed state.

* * * * *